United States Patent
Jones, III

(10) Patent No.: US 8,525,721 B2
(45) Date of Patent: Sep. 3, 2013

(54) LOW POWER CYCLE DATA CONVERTER

(75) Inventor: Robert S. Jones, III, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 84 days.

(21) Appl. No.: 13/237,092

(22) Filed: Sep. 20, 2011

(65) Prior Publication Data

US 2013/0069811 A1      Mar. 21, 2013

(51) Int. Cl.
*H03M 1/34* (2006.01)

(52) U.S. Cl.
USPC ........................................... 341/163; 341/155

(58) Field of Classification Search
USPC ................... 341/155, 172, 163, 161
See application file for complete search history.

(56) References Cited

U.S. PATENT DOCUMENTS

| | | | |
|---|---|---|---|
| 5,644,313 A * | 7/1997 | Rakers et al. | 341/163 |
| 6,489,914 B1 * | 12/2002 | Jones et al. | 341/162 |
| 6,535,157 B1 | 3/2003 | Garrity et al. | |
| 6,909,393 B2 * | 6/2005 | Atriss et al. | 341/163 |
| 6,967,611 B2 | 11/2005 | Atriss et al. | |
| 7,589,658 B2 * | 9/2009 | Ren et al. | 341/161 |

OTHER PUBLICATIONS

Sumanen, et al., "A Single-Amplifier 6-Bit CMOS Pipeline A/D Converter for WCDMA Receivers", IEEE, 2001, pp. 584-587.

* cited by examiner

*Primary Examiner* — Brian Young
(74) *Attorney, Agent, or Firm* — Mary Jo Bertani; James L. Clingan, Jr.

(57) ABSTRACT

A redundant signed digit (RSD) analog to digital converter (ADC) receives a high voltage (VRH) and a low voltage (VRL) for use in converting an input signal to a digital signal. A doubling circuit receives the input signal and doubles the input signal to provide a doubled input signal using an amplifier and a first capacitor. The first capacitor has a capacitance of a first magnitude. A VR circuit continues processing the doubled input signal to provide a 2VR signal. A Vref circuit (VR+C5 and C6) provides a first RSD residue signal that is equal to a sum of a reference Vref and the 2VR signal. The first RSD residue signal is produced using the amplifier, a second capacitor, and the high power supply voltage. The second capacitor has a capacitance equal to half that of the first capacitor.

19 Claims, 6 Drawing Sheets

LOW POWER CYCLE DATA CONVERTER

BACKGROUND

1. Field

This disclosure relates generally to semiconductor devices, and more specifically, to circuits for converting analog data to digital data.

2. Related Art

Digital signal processing has been proven to be very efficient in handling and manipulating large quantities of data. There are many products that are in common use such as wireless devices, digital cameras, motor controllers, automobiles, and toys, to name a few, that rely on digital signal processing to operate. Many of these products continuously receive information that is monitored and used to produce adjustments to the system thereby maintaining optimum performance. The data is often an analog signal that must be converted to a representative digital signal. For example, light intensity, temperature, revolutions per minute, air pressure, and power are but a few parameters that are often measured. Typically, an analog to digital (A/D) converter is the component used to convert an analog signal to a digital signal. In general, the conversion process comprises periodically sampling the analog signal and converting each sampled signal to a corresponding digital signal.

Many applications require the analog to digital converter(s) to sample at high data rates, operate at low power, and provide high resolution. These requirements are often contradictory to one another. Furthermore, cost is an important factor that directly correlates to the amount of semiconductor area needed to implement a design. One type of analog to digital converter that has been used extensively is a redundant signed digit (RSD) analog to digital converter. The RSD analog to digital converter typically comprises one or more RSD stages and a sample/hold circuit. In one embodiment, a sampled voltage is compared against a high reference voltage and a low reference voltage. The result of the comparison is used to determine a bit (1 or 0) from the RSD stage. A residue voltage is then generated that relates to the sampled voltage less the voltage value of the extracted bit. The residue voltage is then provided to another RSD stage or fed back in a loop to continue the conversion process to extract bits until the least significant bit is generated.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIGS. 6-11 are schematic circuit diagrams of the analog section of FIG. 3 showing the resulting circuit topology with different settings of switches P1, P2, h1, h2, m1, m2, l1, and l2 at different values of a residue voltage.

DETAILED DESCRIPTION

Figure 1:
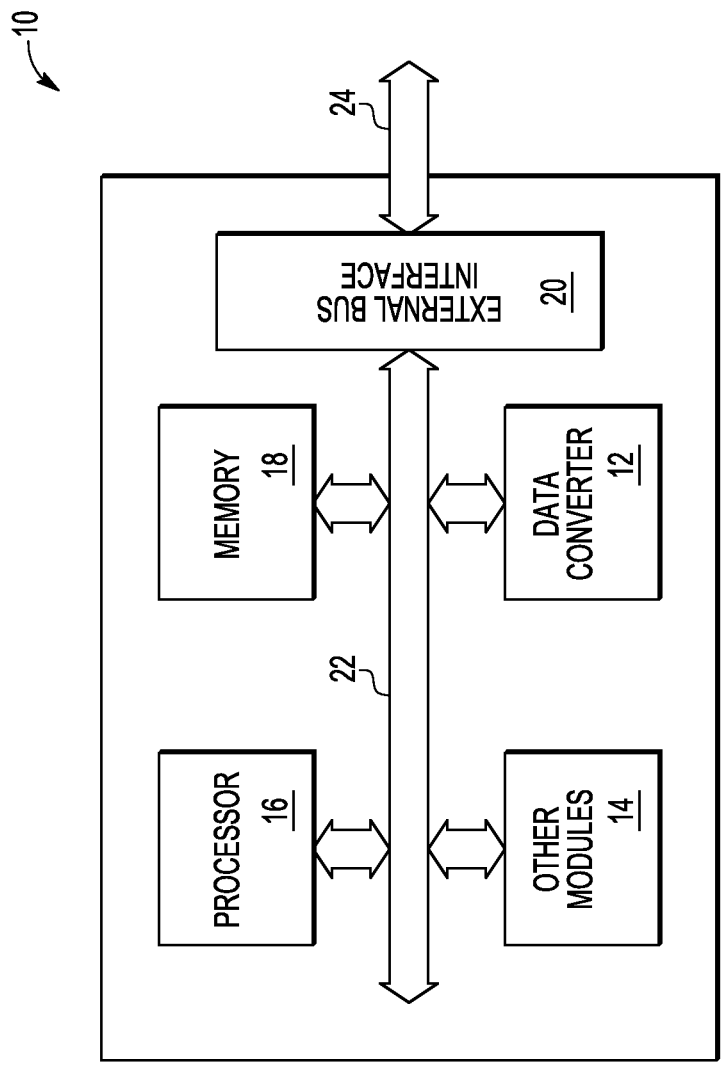
FIG. 1 is a schematic block diagram illustrating an embodiment of a processing system in which a data converter can be used.

The detailed description set forth below in connection with the appended drawings is intended as a description of some embodiments of the invention, and is not intended to represent the only forms in which the present invention may be practiced. It is to be understood that the same or equivalent functions may be accomplished by different embodiments that are encompassed within the spirit and scope of the invention. In the drawings, like numerals are used to indicate like elements throughout.

FIG. 1 illustrates one embodiment of a processing system 10. In alternate embodiments, system 10 may be implemented as a semiconductor device as a single integrated circuit, may be implemented as a plurality of integrated circuits, or may be implemented as a combination of integrated circuits and discrete components. Alternate embodiments may implement system 10 in any manner.

In one embodiment, system 10 comprises data converter 12, other modules 14, processor 16, memory 18, and external bus interface 20, which are all bi-directionally coupled to each other by way of a bus 22 or a plurality of electrical signals 22. In one embodiment, system 10 can receive inputs and provide outputs by way of a bus 24 or a plurality of electrical signals 24 coupled to external bus interface 20. In alternate embodiments, system 10 may comprises fewer, more, or different blocks of circuitry than those illustrated in FIG. 1.

Figure 2:
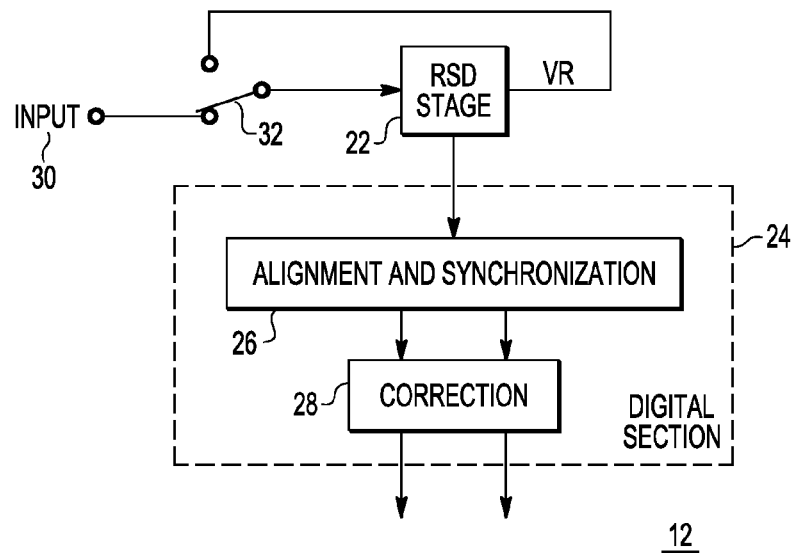
FIG. 2 is a schematic block diagram of a single stage RSD A/D converter in accordance with the present invention.

Referring now to FIG. 2, a block diagram of a cyclic analog to digital data converter 12 in accordance with the present invention is shown. The data converter 12 includes a single RSD stage 22 and a digital section 24. The single RSD stage 22 is capable of maintaining the sample rate and resolution of prior art two-stage architectures without increasing the speed of the required gain/addition/subtraction circuitry. Only the speed of the comparators is increased. The gain/addition/subtraction functions that previously required two stages are implemented with one stage through the use of an efficient architecture that does not require an increase in speed, thereby resulting in significant area and power savings.

An analog input signal is provided to the RSD stage 22 from an input terminal 30 by way of a first switch 32. The RSD stage 22 provides a digital output signal to the digital section 24. The RSD stage 22 also generates a residual voltage signal VR, which is fed back by way of the first switch 32. The first switch 32 is closed for the first cycle, in which the analog input signal is received, and then opened for the remaining number of cycles that it takes to complete converting the analog signal to a digital signal. The feedback loop of the RSD stage 22 can be directly connected from the RSD stage 22 output to the first switch 32. The number of required cycles depends on the number of bits in the digital output signal. For example, as described in more detail below, for a ten bit output signal, ten comparator clock cycles are needed, while only five gain/addition/subtraction circuitry clock cycles (10 clock phases) are needed as was the case with the original two-stage architecture.

The digital section 24, like the digital section 14 of the A/D converter 10 shown in FIG. 1, has an alignment and synchronization block 26 and a correction block 28. The digital bits output from the RSD stage 22 are provided to the digital section 24, where they are aligned, synchronized, and combined to provide a standard format binary output code. There are a number of ways to perform the alignment and synchronization, such as taught in U.S. Pat. No. 5,644,313, and embodiments of the present invention are not intended to be limited to any particular technique.

Figure 3:
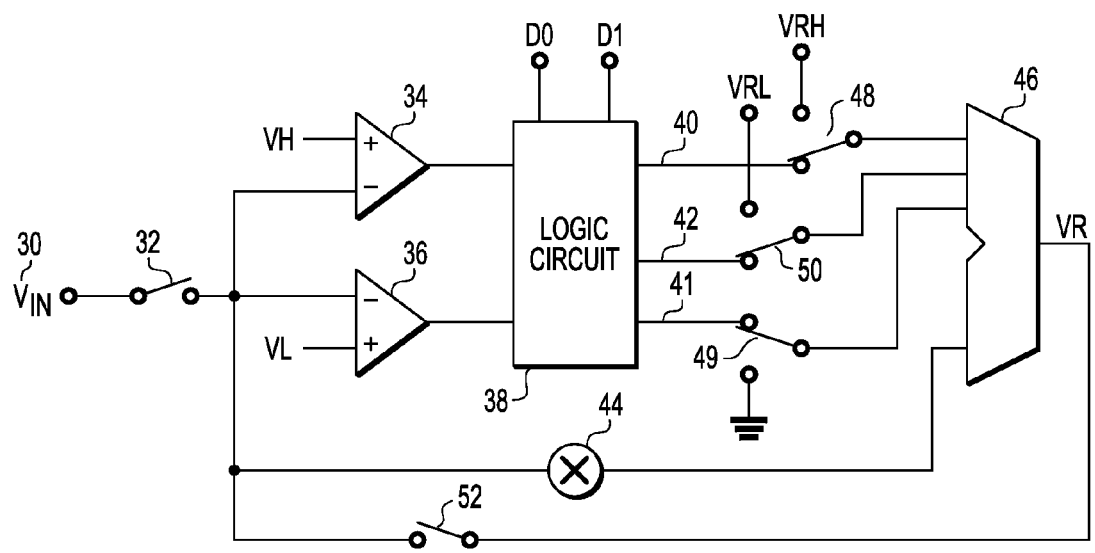
FIG. 3 is a schematic block diagram of one embodiment of the analog section of the A/D converter of FIG. 2.

Referring now to FIG. 3, a schematic block diagram of an embodiment of the RSD stage 22 is shown. The RSD stage 22 includes the input terminal 30 at which the analog input signal or voltage is applied and the first switch 32 that is used to select the analog input signal as the input to the RSD stage 22.

The RSD stage 22 further includes a first comparator 34 and a second comparator 36. The first comparator 34 has a first terminal connected to the first switch 32 that receives either the analog input signal or the residual voltage feedback signal VR and a second terminal that receives a first predetermined voltage signal. The residual voltage feedback signal VR can be provided to the first comparator 34 via a direct feedback signal path as shown in FIG. 3 (i.e, no intervening circuitry, such as a sample and hold circuit). The first comparator 34 compares the signals applied to its input terminals and generates a first comparator output signal.

The second comparator 36 also has a first terminal connected to the first switch 32 that receives either the analog input signal or the residual voltage feedback signal VR and a second terminal that receives a second predetermined voltage signal. Similar to the first comparator 34, the residual voltage feedback signal VR is provided to the second comparator 36 via a direct feedback signal path, with no intervening circuitry, as shown in FIG. 3. The second comparator 36 compares the selected one of the analog input signal and the residual voltage feedback signal VR to the second predetermined voltage signal and generates a second comparator output signal.

In some embodiments, the first predetermined voltage signal is a predetermined high voltage (VH) applied to a positive input terminal of the first comparator 34 and the second predetermined voltage signal is a predetermined low voltage (VL) applied to a positive input terminal of the second comparator 36. The selected one of the analog input signal and the residual voltage feedback signal is input to a negative input terminal of the first and second comparators 34, 36. The values for VH and VL are a function of process technology since that may limit power supply voltages. However, in some embodiments, VH=(VRH−VRL)/2+0.25(VRH−VRL)/2 which is about 3.125 v, while VL=(VRH−VRL)/2−0.25 (VRH−VRL)/2 is about 1.875 v.

The outputs of the first and second comparators 34, 36 are connected to a logic circuit 38, which receives the first and second comparator output signals and generates a two-bit digital output signal D0, D1 representative of the analog input signal. The logic circuit 38 works in the same manner as the logic circuit described in U.S. Pat. No. 5,644,313. For the first cycle, the raw digital output bits D0, D1 are aligned and synchronized in the digital section 24 and then combined with the digital output bits from subsequent cycles to form a standard format binary output code as discussed in more detail below. The logic circuit 38 also generates a high switch control signal 40, a mid switch control signal 41, and a low switch control signal 42 based on the first and second comparator output signals.

The RSD stage 22 also includes a gain block 44 having an input connected to the first switch 32. The gain block 44 receives the selected one of the analog input signal and the residual voltage feedback signal VR and generates a gain block output signal. In some embodiments, the gain block 44 multiplies the voltage input thereto by a factor of 2.

A summing circuit or adder 46 is connected to the output of the gain block 44. The adder 46 generates the residual voltage feedback signal VR by adding the gain block output signal to a first reference voltage, a second reference voltage, or zero. The first and second reference voltages, or zero are selected using the high, mid and low switch control signals 40, 41, and 42 generated by the logic circuit 38. More particularly, a predetermined high reference voltage source (VRH) is connected to the adder 46 by way of a second switch 48, a predetermined zero voltage is connected to the adder 46 by way of a third switch 49, and a predetermined low reference voltage source (VRL) is connected to the adder 46 by way of a fourth switch 50. The second switch 48 is controlled by the high switch control signal 40, the third switch 49 is controlled by the mid switch control signal 41, and the fourth switch 50 is controlled by the low switch control signal 42. Voltage values generally are a function of the semiconductor process being used, such as 90 mm, 45 mm, etc. However, an example of voltages that can be used in some implementations is voltage Vdd is about 5.0 v, +VRH is about 3.75 v and VRL is about 1.25 v.

A feedback switch 52 is provided for selecting the residual voltage feedback signal VR as an input to the gain block 44 and the first and second comparators 34, 36. The feedback switch 52 is located at a node between the inputs to the first and second comparators 34, 36, the input to the gain block 44, and the output of the adder 46. When the feedback switch 52 is closed, the first switch 32 is open so that the residual voltage feedback signal VR is input to the first and second comparators 34, 36 and the gain block gain 44. When the first switch 32 is closed, the feedback switch 52 is open so that the analog input signal is input to the gain block 44 and the first and second comparators 34, 36. As previously discussed, the first switch 32 is closed in a first cycle of converting an analog input signal and the first switch 32 is opened for subsequent cycles of converting the analog input signal.

In one embodiment of the invention, the logic circuit 38 operates in accordance with the conditions specified in Table 1.

TABLE 1

| Input Voltage | D0 | D1 | Switch 48 | Switch 50 | Switch 49 |
|---|---|---|---|---|---|
| Vin > VH | 1 | 0 | open | closed | open |
| VL < Vin < VH | 0 | 1 | open | open | closed |
| Vin < VL | 0 | 0 | closed | open | open |

As will be discussed in more detail below, since the data converter 12 has only a single RSD stage 22, the first and second comparators 34, 36 operate at about two times the speed of the gain block 44 and the adder 48.

Figure 4:
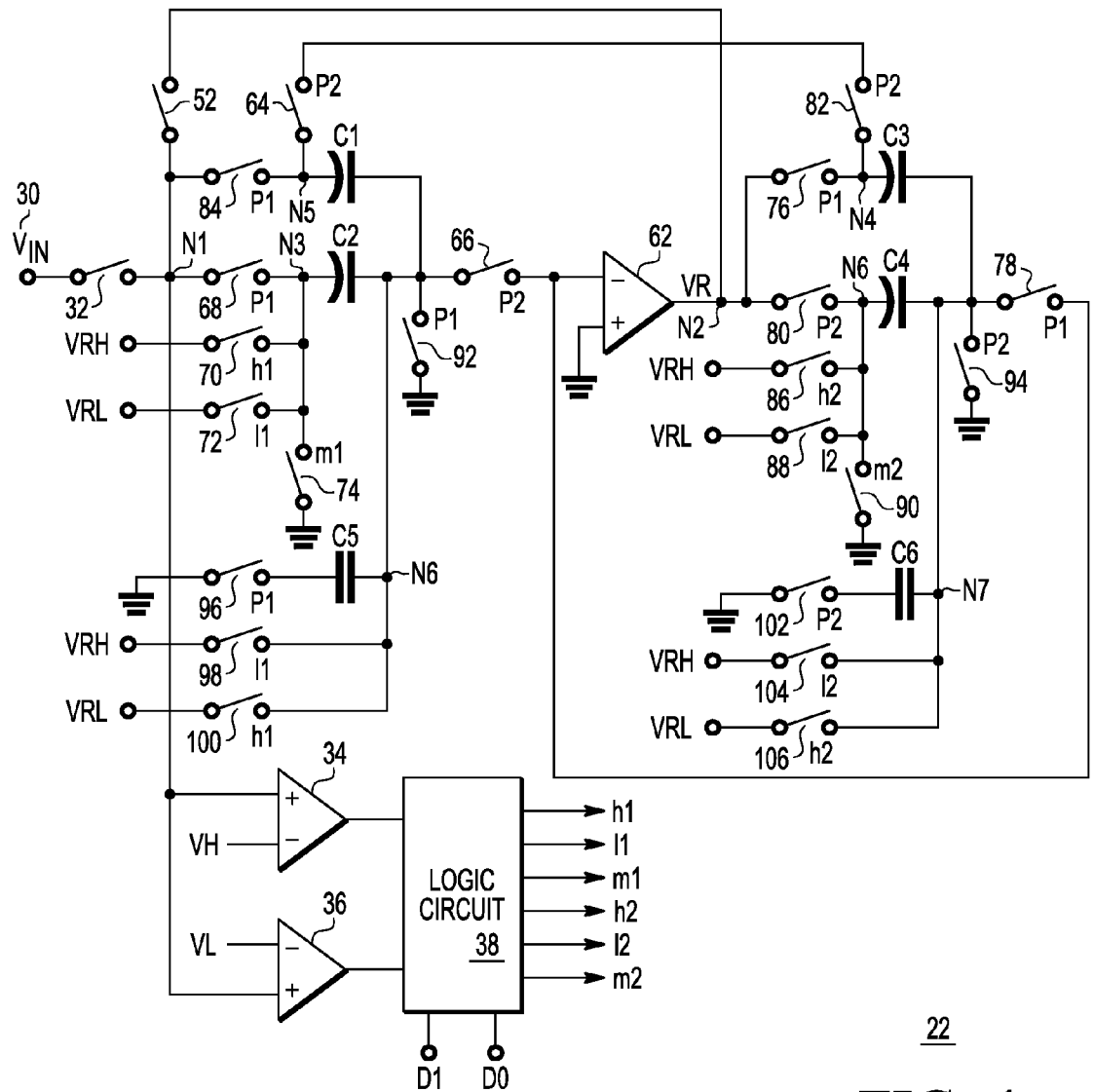
FIG. 4 is a schematic circuit diagram of the analog section of FIG. 3.

FIG. 4 is a more detailed schematic circuit diagram of RSD stage 22 in accordance with some embodiments of the invention. The RSD stage 22 includes the input terminal 30 that receives an analog input voltage signal Vin. The first switch 32 is connected between the input terminal 30 and a first node N1 for selectively applying the analog input signal to the first node N1. The feedback switch 52 is connected between the first node N1 and a second node N2 for selectively applying the residual voltage feedback signal VR to the first node N1. As previously discussed, when the first switch 32 is closed, the feedback switch 52 is open and when the first switch 32 is open, the feedback switch 52 is closed. The first switch 32 is closed in a first cycle of an A/D operation and the feedback switch 52 is closed in subsequent cycles of the A/D operation.

When the feedback switch 52 is closed, a residual voltage feedback signal VR is applied to the first node N1.

The first comparator 34 has a positive input terminal connected to the first node N1 and a negative input terminal that receives the predetermined high voltage VH. The first comparator 34 compares a selected one of the analog input signal and the residual voltage feedback signal, as determined by the position of the first switch 32 and the feedback switch 52 to the predetermined high voltage VH, and generates a first comparator output signal. The second comparator 36 has its positive input terminal connected to the first node N1 and its negative input terminal receives the predetermined low voltage VL. The second comparator 36 compares the selected one of the analog input signal and the residual voltage feedback signal to the predetermined low voltage VL and generates a second comparator output signal.

An operational amplifier 62 has a negative input terminal coupled to the first node N1 for receiving the selected one of the analog input signal and the residual voltage feedback signal. A positive input terminal of the operational amplifier 62 is connected to ground. An output terminal of the operational amplifier 62 is connected to the second node N2. The operational amplifier 62 generates the residual voltage feedback signal VR and applies it the second node N2. As previously discussed, the residual voltage feedback signal VR is provided directly from the output of the operational amplifier 62 at the second node N2 to the input of the operational amplifier 62 without an intervening sample and hold circuit.

The logic circuit 38 is connected to the first and second comparators 34, 36 and receives the first and second comparator output signals. The logic circuit 38 generates a digital output signal D0, D1 based on the first and second comparator output signals (see Table 2). The logic circuit 38 also generates a plurality of control signals h1, h2, l1, l2, m1 and m2, which are used to control the switches of the RSD stage 22. The control signals h1, h2, l1, l2, m1 and m2 correspond to the high, mid and low switch control signals 40, 41, and 42 of FIG. 3.

The gain block 44 and adder circuit 46 of FIG. 3 are implemented using shared circuitry, including the operational amplifier 62 and capacitors and switches shown in FIG. 4 and described in detail below.

A first capacitor C1 is connected to the second node N2 by way of a third switch 64 and to the negative input terminal of the operational amplifier 62 by way of a fourth switch 66. The third and fourth switches 64, 66 are controlled with a clock signal p2. A second capacitor C2 is connected to the negative input terminal of the operational amplifier 62 by way of the fourth switch 66 and to the first node by way of a fifth switch 68. The fifth switch 68 is controlled by a clock signal p1.

A sixth switch 70 is connected between a first reference voltage source (VRH) and a third node N3 located between the second capacitor C2 and the fifth switch 68. The sixth switch is controlled by the signal h1 generated by the logic circuit 38. A seventh switch 72 is connected between a second reference voltage source (VRL) and the third node N3. The seventh switch 72 is controlled by the signal l1 generated by the logic circuit 38. An eighth switch 74 is connected between a zero voltage or ground and the third node N3. The eighth switch 74 is controlled by the signal m1 generated by the logic circuit 38.

A third capacitor C3 is connected to the second node N2 by way of a ninth switch 76 and to the negative input terminal of the operational amplifier 62 by way of a tenth switch 78. The ninth switch 76 is controlled by clock signal p2 and the tenth switch 78 is controlled by the clock signal p1. A fourth capacitor C4 is connected to the second node N2 by way of an eleventh switch 80 and to the negative input terminal of the operational amplifier 62 by way of the tenth switch 78. The eleventh switch 80 is controlled by the clock signal p2. A twelfth switch 82 is connected between the second node N2 and a fourth node N4 located between the third capacitor C3 and the ninth switch 76. The twelfth switch 82 is controlled by the clock signal p1. A thirteenth switch 84 is connected between the feedback switch 52 and a fifth node N5, which is located between the first capacitor C1 and the third switch 64. The thirteenth switch 84 is controlled by the clock signal p1.

A fourteenth switch 86 is connected between the first reference voltage source (VRH) sixth node N6 located between the eleventh switch 80 and the fourth capacitor C4. The fourteenth switch 86 is controlled by control signal h2 generated by the logic circuit 38. A fifteenth switch 88 is connected between the second reference voltage source (VRL) and the sixth node N6. The fifteenth switch 88 is controlled by the control signal l2 generated by the logic circuit 38. A sixteenth switch 90 is connected between the sixth node N6 and ground. The sixteenth switch 90 is controlled by the control signal m2 generated by the logic circuit 38.

A seventeenth switch 92 is connected between zero voltage or ground and the first and second capacitors C1, C2. The seventeenth switch 92 is controlled by the clock signal p1.

An eighteenth switch 94 is connected between zero voltage or ground and the third and fourth capacitors C3, C4. The eighteenth switch 94 is controlled by the clock signal p2.

A fifth capacitor C5 is connected between the negative input terminal of the operational amplifier 62 and a nineteenth switch 96. The nineteenth switch 96 is controlled with clock signal p1.

A twentieth switch 98 is connected between a first reference voltage source (VRH) and a sixth node N6 located between the fifth capacitor C5 and the twentieth switch 98. The twentieth switch 98 is controlled by the signal l1 generated by the logic circuit 38. A twenty-first switch 100 is connected between a second reference voltage source (VRL) and the sixth node N6. The twenty-first switch 100 is controlled by the signal h1 generated by the logic circuit 38.

A sixth capacitor C6 is connected between the negative input terminal of the operational amplifier 62 and a twenty-second switch 102. The twenty-second switch 102 is controlled with clock signal p2.

A twenty-third switch 104 is connected between a first reference voltage source (VRH) and a seventh node N7 located between the sixth capacitor C6 and the twenty-second switch 102. The twenty-third switch 104 is controlled by the signal l2 generated by the logic circuit 38. A twenty-fourth switch 106 is connected between a second reference voltage source (VRL) and the seventh node N7. The twenty-fourth switch 106 is controlled by the signal h2 generated by the logic circuit 38.

In some embodiments, the value of capacitor C5 is one-half the value of capacitor C1 or capacitor C2. The value of capacitor C6 is one-half the value of capacitor C3 or capacitor C4. Capacitors C1 and C2 have the same value, and capacitors C3 and C4 have the same value, within manufacturing tolerances. Other suitable values for capacitors C1-C6 can be used. Data converter 12 only requires a single RSD stage 22 using switched capacitors C5 and C6 to supply reference voltages. Capacitors C5 and C6 subtract half of the reference voltage to appropriately scale the reference signal, since the reference signal is double. Capacitors C5 and C6 thus eliminate the need for an additional amplifier stage required in prior art data converters.

Figure 5:
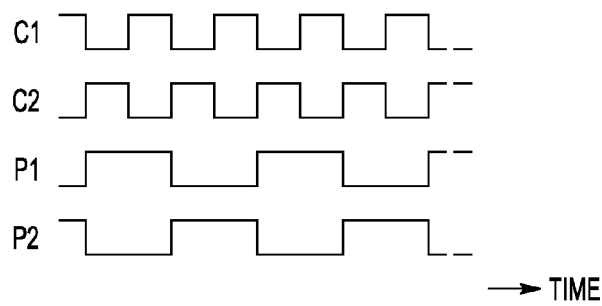
FIG. 5 is timing diagram of control signals of the analog section shown in FIG. 4.

FIG. 5 is a timing diagram showing the clock signals c1, c2, p1 and p2 of the RSD stage 22 shown in FIG. 4. The clock signals c1 and c2 are used to operate the first and second comparators 34, 36, while the clock signals p1, p2 operate the switches 64, 66, 68, 76, 78, 80, 82, 84, 96, and 102. The timing diagram shows that the first and second comparators 34, 36 operate at about two times the speed of the operational amplifier 62. FIGS. 4 and 5 show only four clock signals for simplicity and should in no way exclude the use of additional clock phases in other embodiments of the present invention. It should be noted that although only four clock signals (c1, c2, p1, and p2) are shown, delayed versions of these signals can be applied to operate the switches that are connected to the inverting input of the operational amplifier or other critical locations to reduce errors in the sampling and residue generation process.

FIGS. 6-11 are schematic circuit diagrams of the analog section of FIG. 3 showing the resulting circuit topology with different settings of switches P1, P2, h1, h2, m1, m2, l1, and l2 at different values of the residue voltage $VR_{old}$ for the clock cycle immediately preceding the current clock cycle as shown in Table 2. (VR represents the residue voltage calculated during the current clock cycle.)

TABLE 2

| $VR_{old}$ | VR | h1 | h2 | m1 | m2 | l1 | l2 |
|---|---|---|---|---|---|---|---|
| $VR_{old}$ > VH | $2VR_{old}$ – Vref | p2 | p1 | open | open | open | open |
| VL ≤ $VR_{old}$ ≤ VH | $2VR_{old}$ | open | open | p2 | p1 | open | open |
| $VR_{old}$ < VL | $2VR_{old}$ + Vref | open | open | open | open | p2 | p1 |

VREF = (VRH – VRL)/4

Figure 6:
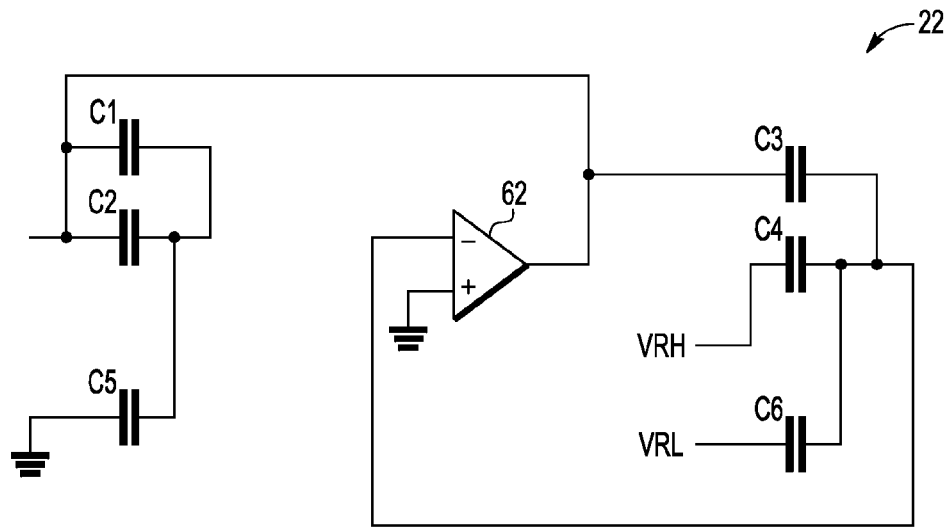
FIG. 6 is a schematic circuit diagram of the analog section of FIG. 3 when switch P1 is asserted and switch P2 is not asserted.

FIG. 6 shows the topology of RSD stage 22 when $VR_{old}$ is greater than 0.25Vref and p1 is closed and p2 is open. Switch h2 is closed and switches h1, m1, m2, l1, and l2 (FIG. 4) are open. The negative input to operational amplifier 62 is coupled to output from capacitors C3, C4, and C6. The positive input to operational amplifier 62 is coupled to ground. The input to capacitor C4 is coupled to +Vref and the input to capacitor C6 is coupled to –Vref. Capacitors C3, C4, and C6 are coupled so that the resulting residue voltage VR is $2VR_{old}$–Vref. The output of capacitor C3 is coupled to the inputs of capacitors C1 and C2. Capacitor C5 is coupled between zero voltage (ground) and the output of capacitor C2. The voltage across capacitors C1, C2 and C5 is thus equivalent to VR. The charge stored in capacitor in C5 is one-half the value of the charge stored in capacitors C1 and C2. Generally, capacitor C2 is used during the comparator compare cycle, while capacitor C1 is used during the comparator hold/reset cycle.

Figure 7:
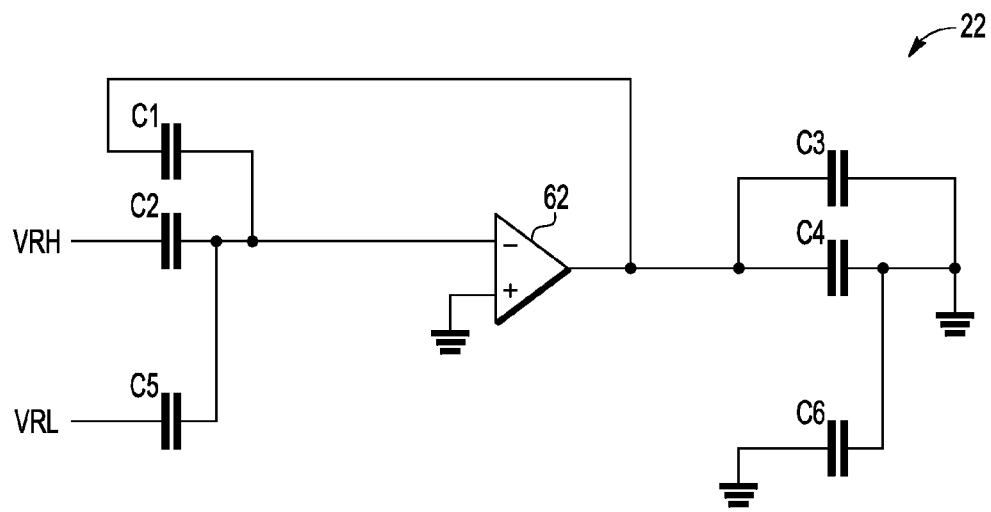

FIG. 7 shows the topology of RSD stage 22 when $VR_{old}$ is greater than 0.25Vref and p1 is open and p2 is closed. Switch h1 is closed and switches h2, m1, m2, l1, and l2 (FIG. 4) are open. The negative input to operational amplifier 62 is coupled to output from capacitors C1, C2, and C3. The positive input to operational amplifier 62 is coupled to ground. The input to capacitor C2 is coupled to +Vref and the input to capacitor C5 is coupled to –Vref. Capacitors C1, C2, and C3 are coupled so that the resulting residue voltage VR is $2VR_{old}$–Vref. The output of capacitor C1 is coupled to the output of operational amplifier 62. The output of operational amplifier 62 is coupled to the input of capacitors C3 and C4. Capacitor C6 is coupled between zero voltage (ground) and the output of capacitor C4. The output of capacitors C3 and C4 are coupled to ground. The voltage across capacitors C3, C4 and C6 is thus equivalent to VR. The charge stored in capacitor in C6 is one-half the value of the charge stored in capacitors C3 and C4. Generally, capacitor C2 is used during the comparator compare cycle, while capacitor C1 is used during the comparator hold/reset cycle.

Figure 8:
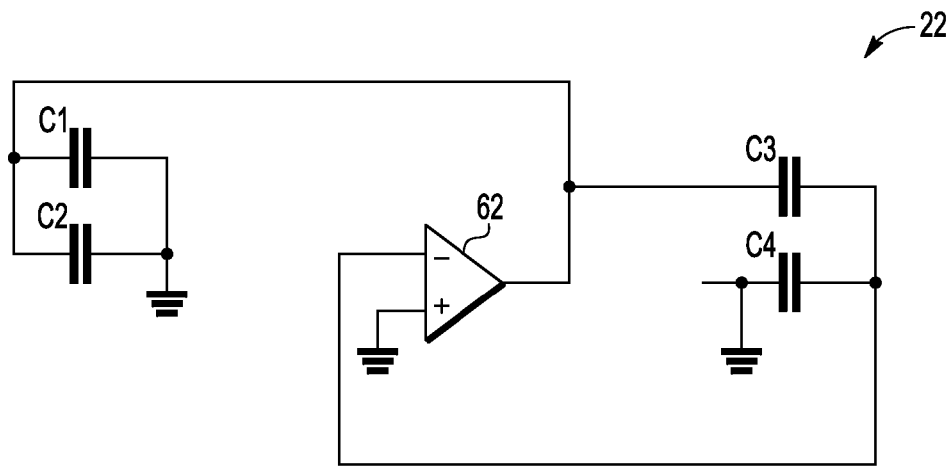

FIG. 8 shows the topology of RSD stage 22 when –0.25Vref is less than or equal to $VR_{old}$ and $VR_{old}$ is less than or equal to 0.25Vref with p1 closed and p2 open. Switch m2 is closed and switches h1, h2, m1, l1, and l2 (FIG. 4) are open. The negative input to operational amplifier 62 is coupled to output from capacitors C3 and C4. The positive input to operational amplifier 62 is coupled to ground. The input to capacitor C4 is also coupled to ground. Capacitors C3 and C4 are coupled so that the resulting residue voltage VR is $2VR_{old}$. The input of capacitor C3 is coupled to the inputs of capacitors C1 and C2. The outputs of capacitors C1 and C2 are coupled to ground. The voltage across each of capacitors C1 and C2 is equivalent to VR. Generally, capacitor C2 is used during the comparator compare cycle, while capacitor C1 is used during the comparator hold/reset cycle.

Figure 9:
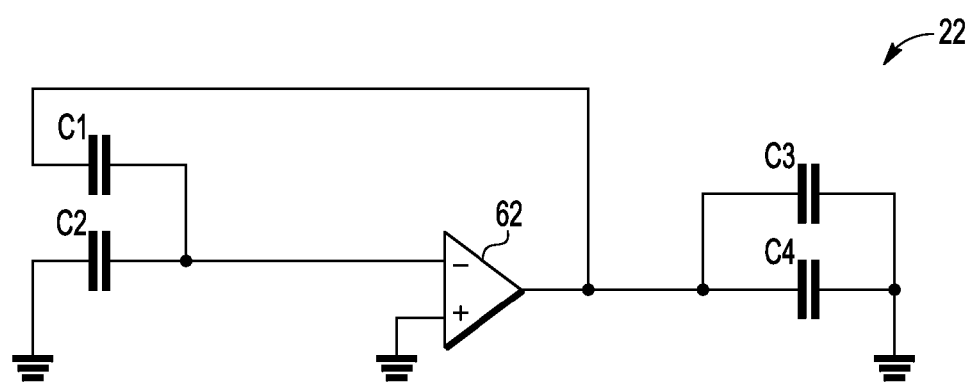

FIG. 9 shows the topology of RSD stage 22 when –0.25Vref is less than or equal to $VR_{old}$ and $VR_{old}$ is less than or equal to 0.25Vref with p1 open and p2 closed. Switch m1 is closed and switches h1, h2, m2, l1, and l2 (FIG. 4) are open. The negative input to operational amplifier 62 is coupled to output from capacitors C1 and C2. The positive input to operational amplifier 62 and the input of capacitor C2 are coupled to ground. The input to capacitor C1 is coupled to the output of comparator 62. Capacitors C1 and C2 are coupled so that the resulting residue voltage VR is $2VR_{old}$. The output of comparator 62 is coupled to the input of capacitors C3 and C4. The outputs of capacitors C3 and C4 are coupled to ground. The voltage across each of capacitors C3 and C4 is thus equivalent to VR. Generally, capacitor C2 is used during the comparator compare cycle, while capacitor C1 is used during the comparator hold/reset cycle.

Figure 10:
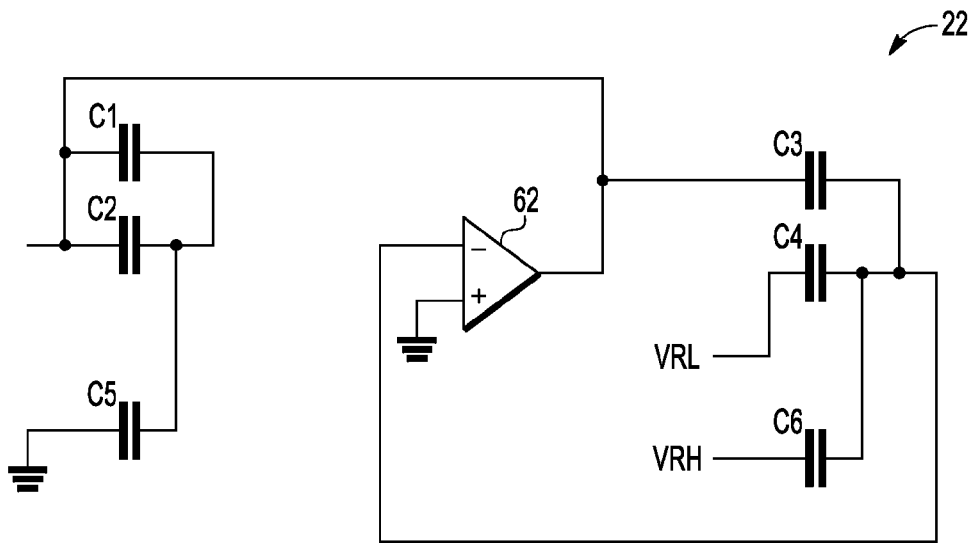

FIG. 10 shows the topology of RSD stage 22 when $VR_{old}$ is less than –0.25Vref with p1 closed and p2 open. Switch l2 is closed and switches h1, h2, m1, m2, and l1 (FIG. 4) are open. The negative input to operational amplifier 62 is coupled to output from capacitors C3, C4, and C6. The positive input to operational amplifier 62 is coupled to ground. The input to capacitor C4 is coupled to VRL and the input to capacitor C6 is coupled to VRH. Capacitors C3, C4, and C6 are coupled so that the resulting residue voltage VR is $2VR_{old}$+Vref. The output of capacitor C3 is coupled to the inputs of capacitors C1 and C2. Capacitor C5 is coupled between zero voltage (ground) and the output of capacitor C2. The voltage across capacitors C1, C2 and C5 is thus equivalent to VR. The charge stored in capacitor in C5 is one-half the value of the charge stored in capacitors C1 and C2. Generally, capacitor C2 is used during the comparator compare cycle, while capacitor C1 is used during the comparator hold/reset cycle.

Figure 11:
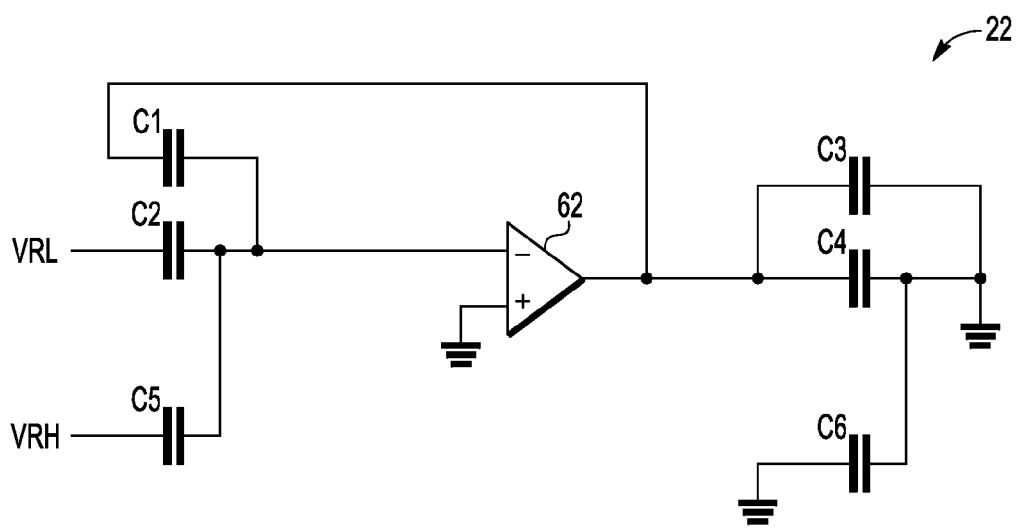

FIG. 11 shows the topology of RSD stage 22 when $VR_{old}$ is less than –0.25Vref and p1 is open and p2 is closed. Switch l1 is closed and switches h1, h2, m1, m2, and l2 (FIG. 4) are open. The negative input to operational amplifier 62 is coupled to output from capacitors C1, C2, and C3. The positive input to operational amplifier 62 is coupled to ground. The input to capacitor C2 is coupled to VRL and the input to capacitor C5 is coupled to VRH. Capacitors C1, C2, and C3 are coupled so that the resulting residue voltage VR is $2VR_{old}$+Vref. The output of capacitor C1 is coupled to the output of operational amplifier 62. The output of operational amplifier 62 is coupled to the input of capacitors C3 and C4. Capacitor C6 is coupled between zero voltage (ground) and the output of capacitor C4. The output of capacitors C3 and C4 are coupled to ground. The voltage across capacitors C3, C4 and C6 is thus equivalent to VR. The charge stored in capacitor in C6 is one-half the value of the charge stored in capacitors C3 and C4. Generally, capacitor C2 is used during the comparator compare cycle, while capacitor C1 is used during the comparator hold/reset cycle.

By now it should be appreciated that embodiments of the single RSD stage A/D converter 12 of the present invention have reduced power requirements and a smaller area than the prior art two-stage RSD A/D. The reduction in power and area are achieved by efficient use of a single operational amplifier included in the gain/addition block. The operational amplifier 62 is used on both phases of the clock so that no time is wasted as it was in the original two-stage architecture. Additional area or real estate savings results from re-using the comparators 34, 36. In some embodiments, only two comparators 34, 36 are required. However, since only two comparators 34, 36 may be used, the two comparators 34, 36 are clocked at about twice the rate as the rest of the circuitry in the RSD stage 22. That is, the comparators 34, 36 can be clocked at twice the rate as in two-stage ADC.

In some embodiments, a redundant signed digit RSD analog to digital converter ADC 12 for receiving a high power supply voltage and a low power supply voltage can include doubling means switches 32, 68, 84, 52 for receiving an input signal to be converted to a digital signal and doubling the input signal to provide a doubled input signal using an amplifier 62 and a first capacitor C1 and for continued processing of the doubled input signal to provide a 2VR signal. The first capacitor has a capacitance of a first magnitude. Vref circuit switches 96 and 102 provide a first RSD residue signal that is equal to a sum of a reference Vref and the 2VR signal, wherein the reference Vref is defined as a voltage having a fixed value less than high power supply voltage and greater than halfway between the low power supply voltage VRL and the high power supply voltage. The first RSD residue signal is produced using the amplifier, a second capacitor C5, and the high power supply voltage VRH. The second capacitor has a capacitance equal to half that of the first capacitor.

In another aspect, a digital signal generator 24 coupled to the Vref circuit for providing a digital output that is a representation of the input signal.

In a further aspect, the Vref circuit further comprises a third capacitor C6. The third capacitor has a capacitance equal to half that of the first capacitor and is used in producing the first RSD residue signal.

In a still further aspect, the first reference Vref has voltage equal to three quarters of the way from the low power supply voltage to the high power supply voltage minus a midpoint voltage that is halfway between the high power supply voltage and the low power supply voltage.

In a still further aspect, the high power supply voltage is applied to the second capacitor and the third capacitor in producing the first RSD residue signal.

In a still further aspect, the high power supply voltage is sequentially applied to the second and third capacitors in producing the first RSD residue signal.

In a still further aspect, −Vref circuit switches 106, 100 provides a second RSD residue signal that is equal to a voltage equal to the reference Vref subtracted from the VR signal. The second RSD residue signal is produced using the amplifier, the second capacitor, the third capacitor, and the low power supply voltage.

In a still further aspect, the low power supply voltage is applied to the second and third capacitors in producing the first RSD residue signal.

In a still further aspect, a −Vref circuit 106, 100 provides a second RSD residue signal that is equal to a voltage equal to the reference Vref subtracted from the VR signal the second RSD residue signal is produced using the amplifier, the second capacitor, and the low power supply voltage.

In a still further aspect, the second capacitor is selectively coupled to a first terminal of the first capacitor and a second terminal is selectively coupled between the high power supply voltage and the low power supply voltage.

In a still further aspect, the doubling means, the VR circuit, and the Vref circuit are switched capacitor circuits.

In another embodiment, a redundant signed digit RSD analog to digital converter ADC, wherein the RSD ADC operates based on a high voltage and a low voltage, comprises an amplifier having an input and an output 62; a digital signal generator 24 coupled to the output of the amplifier for generating a digital signal; and a switched capacitor circuit C1-C6 plus the controller and switches coupled to the input and the output of the amplifier to cause the amplifier to produce RSD residue signals representative of an input signal. The RSD residue signals comprise 2VR, 2VR+Vref, and 2VR−Vref. 2VR is based on a doubled input signal, and Vref is a reference voltage between the high voltage VRH and a midpoint between the high voltage and the low voltage VRL. The switched capacitor circuit C2, C1, C3 comprises a first capacitor C2 having a first capacitance that receives the input signal to be converted to a digital signal, a second capacitor C1, and a third capacitor C5. The first capacitor C2 has a capacitance of a first magnitude. The first capacitor is used, in combination with the amplifier and the second capacitor C1, to provide the doubled input signal. The second capacitor is coupled between the input and the output of the amplifier to double the input signal, the second capacitor C1 has a capacitance of the first magnitude, the third capacitor has a capacitance of a second magnitude, the second magnitude is half the first magnitude; and the third capacitor is coupled between the high voltage and the input of the amplifier to generate the RSD residue signal 2VR+Vref.

In another aspect, the switched capacitor comprises a fourth capacitor C6. The fourth capacitor has a capacitance of the second magnitude; and the fourth capacitor is coupled between the high voltage and the output of the amplifier to generate the RSD residue signal 2VR+Vref.

In another aspect, to generate the RSD residue signal 2Vx+Vref, the third capacitor C3 is coupled between the high voltage and the input of the amplifier after the fourth capacitor is coupled between the high voltage and the output of the amplifier.

In another aspect, the third capacitor C5 is coupled between the low voltage and the input of the amplifier to generate the RSD residue signal 2VR−Vref.

In another aspect, the fourth capacitor C6 is coupled between the low voltage and the output of the amplifier to generate the RSD residue signal 2VR−Vref.

In another aspect, to generate the RSD residue signal 2VR−Vref, the third capacitor is coupled between the low voltage and the input of the amplifier after the fourth capacitor is coupled between the low voltage and the output of the amplifier.

In another aspect, to generate the RSD residue signal 2VR, the third capacitor is decoupled from the input of the amplifier and the fourth capacitor is decoupled from the output of the amplifier.

In another embodiment, a method of generating a plurality of redundant signed digit RSD residue signals for use in generating a digital signal representative of an analog signal is provided. The RSD residue signals comprise RSD residue signals 2VR, 2VR+Vref, and 2VR−Vref where Vref is a reference voltage between the high voltage and a midpoint between the high voltage and the low voltage. The method can include applying the analog signal to a first capacitor C2 that is coupled to an input of an amplifier 62. The amplifier has an output for providing the RSD residue signals. A second capacitor C1 is coupled between the input of the amplifier and an output of the amplifier. The first capacitor has a capacitance of a first magnitude and the second capacitor has a capacitance of the first magnitude. A third capacitor C5 is coupled between a high voltage VRH and the input to generate the 2VR+Vref signal. The third capacitor has a capacitance of a second magnitude. The second magnitude is half the first magnitude.

In another aspect, the method can include coupling the third capacitor between a low voltage VRL and the input of the amplifier to generate the RSD residue signal VR-Vref.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A redundant signed digit (RSD) analog to digital converter (ADC) for receiving a high power supply voltage and a low power supply voltage, comprising:

doubling means for receiving an input signal to be converted to a digital signal and doubling the input signal to provide a doubled input signal using an amplifier and a first capacitor, wherein the first capacitor has a capacitance of a first magnitude;

a VR circuit for continued processing of the doubled input signal to provide a 2VR signal; and a Vref circuit that provides a first RSD residue signal that is equal to a sum of a reference Vref and the 2VR signal, wherein the reference Vref is defined as a voltage having a fixed value less than high power supply voltage and greater than half way between the low power supply voltage and the high power supply voltage, wherein the first RSD residue signal is produced using the amplifier, a second capacitor, and the high power supply voltage, wherein the second capacitor has a capacitance equal to half that of the first capacitor, and the Vref circuit further comprises a third capacitor, wherein the third capacitor has a capacitance equal to half that of the first capacitor and is used in producing the first RSD residue signal.

2. The RSD ADC of claim 1, further comprising:
a digital signal generator coupled to the Vref circuit for providing a digital output that is a representation of the input signal.

3. The RSD ADC of claim 1, wherein the first reference Vref has voltage equal to three quarters of the way from the low power supply voltage to the high power supply voltage minus a midpoint voltage that is halfway between the high power supply voltage and the low power supply voltage.

4. The RSD ADC of claim 1, wherein the high power supply voltage is applied to the second capacitor and the third capacitor in producing the first RSD residue signal.

5. The RSD ADC of claim 4, wherein the high power supply voltage is sequentially applied to the second and third capacitors in producing the first RSD residue signal.

6. The RSD ADC of claim 1, further comprising:
a -Vref circuit that provides a second RSD residue signal that is equal to a voltage equal to the reference Vref subtracted from the VR signal, wherein the second RSD residue signal is produced using the amplifier, the second capacitor, the third capacitor, and the low power supply voltage.

7. The RSD ADC of claim 6, wherein the low power supply voltage is applied to the second and third capacitors in producing the first RSD residue signal.

8. The RSD ADC of claim 1, further comprising:
a -Vref circuit that provides a second RSD residue signal that is equal to a voltage equal to the reference Vref subtracted from the VR signal the second RSD residue signal is produced using the amplifier, the second capacitor, and the low power supply voltage.

9. The RSD ADC of claim 8, wherein the second capacitor is selectively coupled to a first terminal of the first capacitor and a second terminal is selectively coupled between the high power supply voltage and the low power supply voltage.

10. The RSD ADC of claim 1, wherein the doubling means, the VR circuit, and the Vref circuit are switched capacitor circuits.

11. A redundant signed digit (RSD) analog to digital converter (ADC), wherein the RSD ADC operates based on a high voltage and a low voltage, comprising:
an amplifier having an input and an output;
a digital signal generator coupled to the output of the amplifier for generating a digital signal; and a switched capacitor circuit coupled to the input and the output of the amplifier to cause the amplifier to produce RSD residue signals representative of an input signal, wherein:

the RSD residue signals comprise 2VR, 2VR+Vref, and 2VR−Vref;

2VR is based on a doubled input signal;

Vref is a reference voltage between the high voltage and a midpoint between the high voltage and the low voltage;

the switched capacitor circuit comprises a first capacitor having a first capacitance that receives the input signal to be converted to a digital signal;

the first capacitor has a capacitance of a first magnitude;

the first capacitor is used, in combination with the amplifier and a second capacitor, to provide the doubled input signal;

the second capacitor is coupled between the input and the output of the amplifier when the doubled input signal is provided;

the second capacitor has a capacitance of the first magnitude;

the switched capacitor circuit comprises a third capacitor;

the third capacitor has a capacitance of a second magnitude;

the second magnitude is half the first magnitude; and the third capacitor is coupled between the high voltage and the input of the amplifier to generate the RSD residue signal 2VR+Vref.

12. The RSD ADC of claim 11, wherein:

the switched capacitor comprises a fourth capacitor (C6);

the fourth capacitor has a capacitance of the second magnitude; and the fourth capacitor is coupled between the high voltage and the output of the amplifier to generate the RSD residue signal 2VR+Vref.

13. The RSD ADC of claim 12, wherein, to generate the RSD residue signal 2Vx+Vref, the third capacitor is coupled between the high voltage and the input of the amplifier after the fourth capacitor is coupled between the high voltage and the output of the amplifier.

14. The RSD ADC of claim 13, wherein the third capacitor is coupled between the low voltage and the input of the amplifier to generate the RSD residue signal 2VR−Vref.

15. The RSD ADC of claim 14, the fourth capacitor is coupled between the low voltage and the output of the amplifier to generate the RSD residue signal 2VR−Vref.

16. The RSD ADC of claim 15, wherein, to generate the RSD residue signal 2VR−Vref, the third capacitor is coupled between the low voltage and the input of the amplifier after the fourth capacitor is coupled between the low voltage and the output of the amplifier.

17. The RSD of claim 16, wherein, to generate the RSD residue signal 2VR, the third capacitor is decoupled from the input of the amplifier and the fourth capacitor is decoupled from the output of the amplifier.

18. A method of generating a plurality of redundant signed digit (RSD) residue signals for use in generating a digital signal representative of an analog signal, wherein the RSD residue signals comprise RSD residue signals 2VR, 2VR+Vref, and 2VR−Vref where Vref is a reference voltage between the high voltage and a midpoint between the high voltage and the low voltage, the method comprising:

applying the analog signal to a first capacitor that is coupled to an input of an amplifier, wherein the amplifier has an output for providing the RSD residue signals;

coupling a second capacitor between the input of the amplifier and an output of the amplifier, wherein the first capacitor has a capacitance of a first magnitude and the second capacitor has a capacitance of the first magnitude; and coupling a third capacitor between a high voltage and the input to generate the 2VR+Vref signal, wherein the third capacitor has a capacitance of a second magnitude, wherein the second magnitude is half the first magnitude.

19. The method of claim 18, further comprising coupling the third capacitor between a low voltage and the input of the amplifier to generate the RSD residue signal VR−Vref.

* * * * *